United States Patent [19]

Itoh et al.

[11] Patent Number: 4,597,012

[45] Date of Patent: Jun. 24, 1986

[54] TWO-DIMENSIONAL IMAGE READ-OUT SENSOR DEVICE

[75] Inventors: Masataka Itoh, Tenri; Satoshi Nishigaki, Nara; Shohichi Katoh, Yamatokoriyama, all of Japan

[73] Assignee: Sharp Kabushiki Kaisha, Osaka, Japan

[21] Appl. No.: 673,618

[22] Filed: Nov. 21, 1984

[30] Foreign Application Priority Data

Nov. 24, 1983 [JP] Japan ................................ 58-222384

[51] Int. Cl.$^4$ ............................................. H01M 3/14
[52] U.S. Cl. ................................... 358/213; 358/212; 358/294
[58] Field of Search ............... 358/213, 212, 217, 298, 358/293; 357/24 LR; 250/578, 211 J

[56] References Cited

U.S. PATENT DOCUMENTS 4,419,696 12/1983 Hamano et al. ................... 358/294
4,541,015 9/1985 Itoh et al. ........................... 358/212

Primary Examiner—Gene Z. Rubinson
Assistant Examiner—Robert G. Lev
Attorney, Agent, or Firm—Birch, Stewart, Kolasch & Birch

[57] ABSTRACT

A two-dimensional image read-out device comprises an insulating substrate, a plurality of Y-line electrodes formed on the insulating substrate and arranged parallel with each other, a plurality of X-line electrodes formed over the insulating substrate and arranged parallel with each other in a direction perpendicular to the Y-line electrodes, a photoconductive layer interposed between the Y-line and the X-line electrodes, gate electrodes for selecting a pair of the Y-line and the X-line electrodes, and three scanning circuits for selecting some of the Y-line electrodes, and some of the X-line electrodes, and at least one of the gate electrodes, respectively.

18 Claims, 8 Drawing Figures

TWO-DIMENSIONAL IMAGE READ-OUT SENSOR DEVICE

BACKGROUND OF THE INVENTION

The present invention relates to a image read-out device and, more particularly, to a two-dimensional image read-out sensor device which includes sensor elements disposed over two dimensions.

The MOS image sensor, CCD image sensor, close-contact type image sensor, etc. have been developed for an image reading device in, for example, a facsimile machine, an intelligent copier, etc. To read two-dimensional image information, the two-dimensional image information is converted into electric signals by mechanically scanning the one-dimensional image sensor such as the MOS image sensor and the CCD image sensor, in the two-dimensional directions.

Both of the MOS image sensor and the CCD image sensor are formed on a monocrystal semiconductor substrate through the use of the IC (Integrated Circuit) technique. Thus, a large size sensor is difficult to form. Accordingly, the MOS image sensor and the CCD image sensor are generally combined with an optical lens system so as to form a demagnified image on the image sensor elements. The optical lens system requires a predetermined optical path which prevents the reduction of the size of the image reading apparatus.

To solve the optical path problem, the close-contact type image sensor has been proposed, which includes a light responsive member having a size greater than or equal to the original document size. The image of the same size as the original document is formed on the light responsive member via an optical fiber. The contact type image sensor needs the light responsive member having the same size as the original document and, therefore, a uniform photoconductive layer of a considerably large size must be formed.

The close-contact type image sensor employing a photoconductive layer made of CdS-CdSe mixture crystal, amorphous Se, Se compound, amorphous Si or the like has been proposed. However, this type of the image sensor has a complicated construction which needs a complicated manufacturing process therefor. Furthermore, the reading speed is limited by the response speed of the photoconductive layer.

If such a one-dimensional image sensor is used to read two-dimensional image information, the reading speed is considerably slow because the same photoconductive sensor portion of the one-dimensional sensor must be repeatedly scanned on the original document. Moreover, it is difficult to integrally connect the photoconductive sensor portions with switching elements through the use of the IC technique. To connect the photoconductive sensor portions with the switching elements, the switching elements and the photoconductive sensor portions are connected each other on a same substrate by bonding. However, as the number of photoconductive sensor portions is increased for the improvement of the image resolution, the numbers of switching elements (or ICx) is increased, so that a driving circuit has been complicated and the image sensor becomes expensive.

However, no terminal connection suitable for the two-dimensional image read-out sensor device has been proposed. Therefore, the conventional two-dmensional image sensor device has a large and complicated construction and must be driven by a driving circuit having a great number of the switching elements (or ICs).

OBJECT AND SUMMARY OF THE INVENTION

Accordingly, it is an object of the present invention to provide a two-dimensional image read-out sensor which overcomes the foregoing problems, and which ensures accurate and high speed reading of two-dimensional image information.

It is another object of the present invention to provide a two-dimensional image read-out sensor device having a novel wiring construction.

It is still another object of the present invention to provide a two-dimensional image read-out sensor device for reducing the number of switching elements.

It is a further object of the present invention to provide a two-dimensional image read-out sensor device having three types of electrodes so as to switchingly select sensor elements disposed in two dimensions.

Other objects and further scope of applicability of the present invention will become apparent from the detailed description given hereinafter. It should be understood, however, that the detailed description of and specific examples, while indicating preferred embodiments of the invention, are given by way of illustration only, since various changes and modifications within the spirit and scope of the invention will become apparent to those skilled in the art from this detailed description.

According to an embodiment of the present invention, a two-dimensional image read-out sensor device comprises an insulating substrate, a plurality of Y-line electrodes formed in the insulating substrate and arranged parallel with each other, the Y-line electrodes being divided to groups of the Y-line electrodes, each group of the Y-line electrodes having the first to the L-th (L: an integral $\geq 2$) Y-line electrodes in which "l"-th (l: 1–L) Y-line electrodes selected from each of groups of the Y-line electrodes are connected in common to provide Y-side terminals of "L", a plurality of X-line electrodes formed over the insulating substrate and arranged parallel with each other in a direction perpendicular to the Y-line electrodes, the X-line electrodes being divided to groups of the X-line electrodes, each of groups of the X-line electrodes having the first to the K-th (K: an integral $\geq 2$) X-line electrodes in which k-th X-line electrodes (k: 1–K) selected from each of groups of the X-line electrodes are connected in common to provide X-side terminals of "K", a photoconductive layer interposed between the Y-line and the X-line electrodes, a plurality of gate electrodes for selecting a pair of the X-line and the Y-line electrodes, the gate electrodes being divided into groups and the gate electrodes in every group being connected to each other in common to provide a single gate terminal, said each of the groups of the gate electrodes being extended over each area including the Y-line electrodes of "L" and the X-line electrodes of "K" arranged in a matrix, Y-side scanning means, connected to the Y-side terminals, for selecting some of the Y-line electrodes, X-side scanning means, connected to the X-side termnals, for selecting some of the X-line electrodes and, gate scanning means, connected the gate terminals, for selecting at lease one of the gate electrodes The gate electrode groups are interposed in the photoconductive layer and are formed in a mesh shaped, and each of the gate electrode groups controls the current amount in the photoconductive layer by changing a potential at the each of the gate electrode groups.

The above device may include an insulating layer for covering the surface of each of the gate electrode groups which is in contact with the photoconductive layer.

The above device, further, may include a schottky junction formed at the interface between the each of the mesh type gate electrode groups and the photoconductive layer in which the surface of the gate electrode is in contact with the photoconductive layer, or a P-N junction formed at the interface between of each the mesh type gate electrode groups and the photoconductive layer.

According to another embodiment of the present invention, a schottky junction is formed at the interface between each of the Y-line electrodes and the photoconductive layer or at the interface between each of the X-line electrodes and the photoconductive layer.

According to still another embodiment of the present invention, the gate electrode is provided with a thin film transistor inserted into a current path between each of the Y-line electrodes and each of the X-line electrodes.

BRIEF DESCRIPTION OF THE DRAWINGS

The present invention will be better understood from the detailed description given hereinbelow and the accompanying drawings which are given by way of illustration only, and thus are not limitative of the present invention and wherein.

DETAILED DESCRIPTION OF THE INVENTION (Example I)

Figure 1:
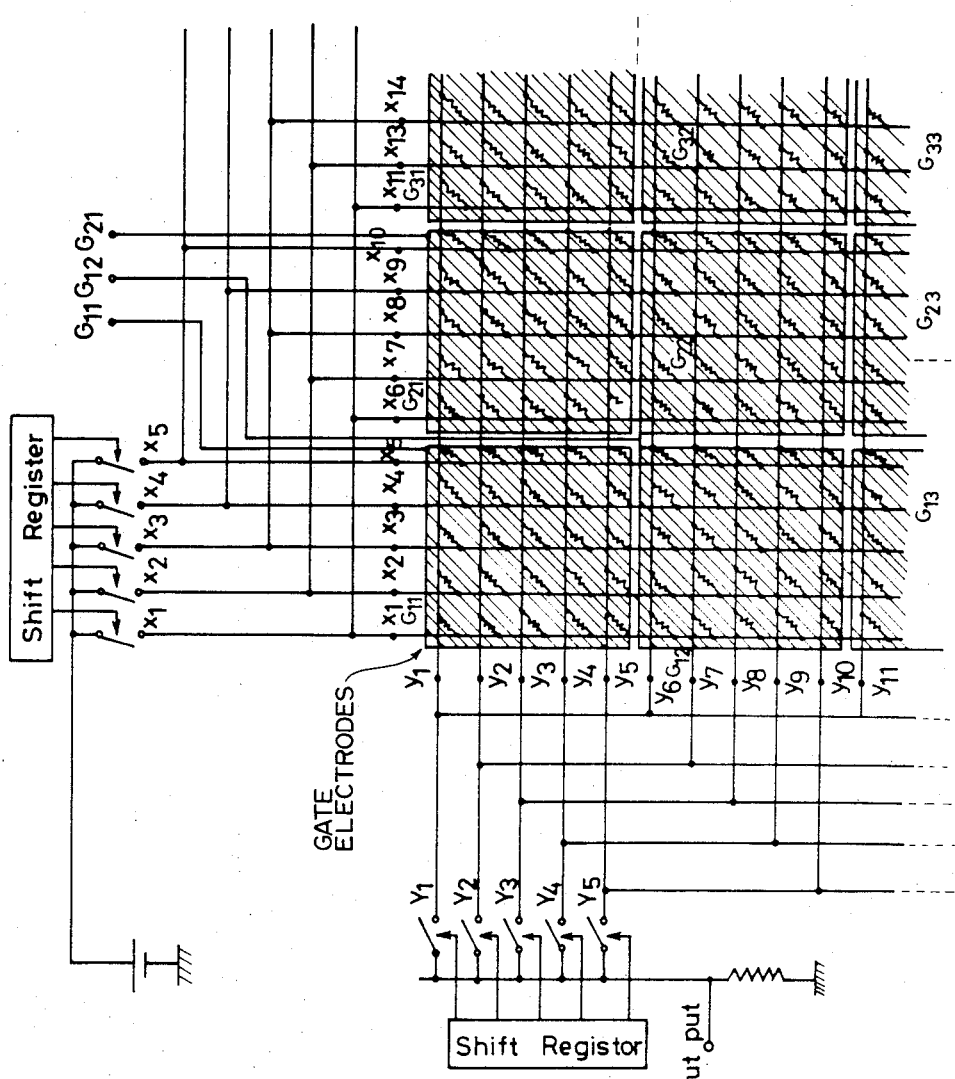
FIG. 1 shows an equivalent circuit of a two-dimensional image read-out sensor device according to an embodiment of the present invention.
Figure 2:
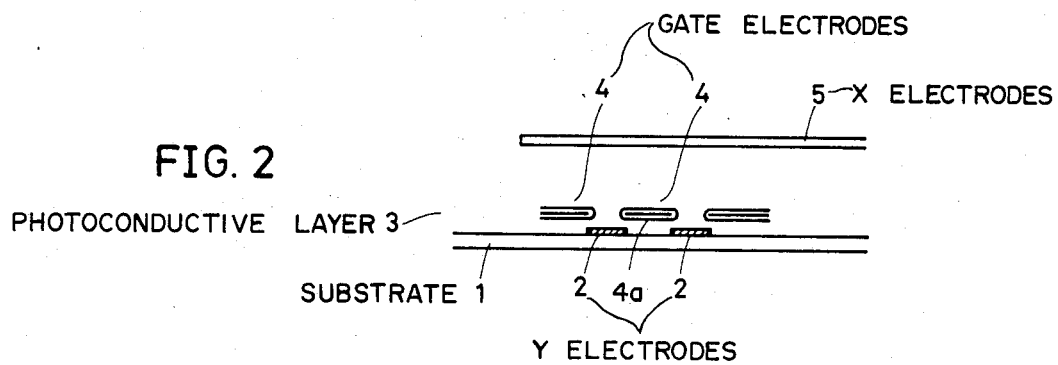
FIGS. 2 and 3 show a partially sectional view and a plan view of the two-dimensional image read-out sensor device of FIG. 1, respectively.
Figure 3:
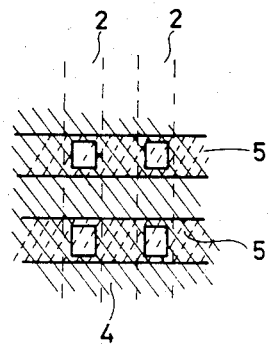

FIG. 1 shows an equivalent circuit of a two-dimensional image read-out sensor device according to an embodiment of the present invention. FIGS. 2 and 3 show a partially sectional view and a plan view of the two-dimensional image read-out sensor device of FIG. 1, respectively.

A two-dimensional image read-out sensor device according to an embodiment of the present invention comprises an insulating substrate 1, a photoconductive layer 3, X-line stripe electrodes 5, Y-line stripe electrode 2, gate electrodes 4, and scanning circuits each including switching elements.

The Y-line stripe electrodes 2 as the lower electrodes are arranged parallel to each other with a constant pitch on the insulating substrate 1. The photoconductive layer 3 covers the insulating substrate 1 and the Y-line stripe electrodes 2, and forms a plurality of image read-out sensor portions disposed in two dimensions as picture elements. The X-line stripe electrodes 5 as the upper electrodes are arranged similarly parallel to each other with a constant pitch, but in a direction perpendicular to the Y-line electrodes 2. Each intersection between the X-line electrodes 5 and Y-line electrodes 2 forms a single picture element as the image read-out sensor portion.

In the embodiment of the present invention, when the number of X-line electrodes 5 is "I", the X-line electrodes 5 of "I" are divided to groups of X-line electrodes, in which the number of groups is assumed to be "M" and the number of X-line electrodes in a single group is assumed to be "K". When the number of Y-line electrodes 2 is "J", the Y-line electrodes of "J" are divided to groups of Y-electrodes, in which the number of groups is assumed to be "N", and the number of Y-line electrodes in a single group is assumed to be "L". The characters "I", "J", "K", "L" "M" and "N" each represent an intergral greater than 1.

Each group of X-line electrodes have the first to the K-th electrodes. The X-line k-th (k: 1-K) electrodes selected from each of groups of X-line electrodes are connected in common to provide X terminals of "K" for connecting to the switching elements in the X-side scanning circuit.

Each group of Y-line electrodes have the first to the L-th electrodes. The Y-line l-th (l: 1-L) electrodes selected from each of groups of Y electrodes are connected in common to provide Y terminals of "L" for connecting to the switching elements in the Y-side scanning circuit.

In the embodiment of the present invention, the single group of X-line electrodes of "K" and the single group of Y-line electrodes of "L" are provided as a single block area, so that the number of blocks in the two-dimensional image read-out sensor device is "M×N" becaue of the presence of "M" groups of X-line electrodes ans "N" groups of Y-line electrodes.

As the photoconductive layer 3 disposed at each intersection between the X-line electrodes 5 and the Y-line electrodes 2 forms the single picture element as the image read-out sensor portion, the image read-out sensor portions of "K×L" are formed in the single block area because of the presence of X-line elec trodes of "K" and the Y-line electrodes of "L".

The gate electrodes 4 are formed in the photoconductive layer 3 and interposed between the X-line electrodes 5 and the Y-line electrodes 2, and the gate electrodes 4 of "K×L" in the single block area are connected to each other in common to provide a single terminal for connecting the switching element in the gate scanning circuit. Each group of the gate electrodes extends over the single block area including the X-line electrodes of "K" and the Y-line electrodes of "L" arranged each other in a matrix. Hereinafter, a group of gate electrodes 4 is designated by $G_{MN}$ (M: 1-M, N: 1-N). The number of groups of the gate electrodes is "M×N" in the two-dimensional image read-out sensor device. Accordingly, the groups of the gate electrodes provide gate terminals of "M×N" for connecting to the switching elements in the gate-side scanning circuit.

Each gate electrode group $G_{MN}$ is in a mesh construction and has holes at the portions corresponding to the intersections between the X-line electrodes 5 and the Y-line electrodes 2, as wide as the picture element size (or the electrode size).

As shown in FIGS. 2 and 3, the Y-line stripe electrodes 2 made of Aluminium are formed on the insulating substrate 1 such as a glass, and the photoconductive layer 3 made of amorphous silicon hydride (a-Si:H) covers the insulating substrate 1 and the Y-line electrodes 2. The mesh type gate electrode groups $G_{MN}$ are disposed into the photoconductive layer 3 adjacent to the Y-line electrodes 2. An oxidation layer 4a covers and coats on each of the mesh type gate electrode groups $G_{MN}$. After forming the photoconductive layer 3 and the mesh type electrode groups $G_{MN}$, the transparent X-line stripe electrodes 5 as the upper electrodes are formed on the photoconductive layer 3.

As shown in FIG. 1, if both the number of X-line electrodes 5 and the number of Y-line electrodes 2 in the single group are set at 5 (K=5 and L=5), the X-line electrodes $x_1, x_6, x_{11}, \ldots x_{5M-4}$ are connected to each other in common to provide an X terminal $X_1$, and the Y-line electrodes $y_1, y_6, y_{11}, \ldots y_{5N-4}$ are connected to each other in common to provide a Y terminal $Y_1$. In the same manner, the X-line electrodes $x_2, x_7, \ldots x_{5M-3}$ are connected to each other in common to link as an X terminal $X_2$, and the Y-line electrodes $y_2, y_7, \ldots y_{5N-3}$ are connected to each other in common to line as a Y terminal $Y_2$. Finally, the X-line electrodes $x_5, x_{10}, \ldots x_{5M}$ are connected to each other in common to link as an X terminal $X_5$, and the Y-line electrodes $y_5, y_{10}, \ldots y_{5N}$ are connected to each other in common to provide a Y terminal $Y_5$. Accordingly, each of the X terminals $X_1, X_2, X_3, X_4$, and $X_5$ is connected to each of the X-side switching elements in the X-side scanning circuit, respectively. Each of the Y terminals $Y_1, Y_2, Y_3, Y_4$, and $Y_5$ is connected to each of the Y-side switching elements in the Y-side scanning circuits, respectively.

Each of the mesh type gate electrode groups $G_{MN}$ covers each of the blocks each including the X-line electrodes of "5" and the Y-line electrodes of "5". For example, the mesh type gate electrode group $G_{11}$ covers the single block area including the X-line electrodes $x_1, x_2, x_3, x_4$, and $x_5$ and the Y-line electrodes $y_1, y_2, y_3, y_4$, and $y_5$.

If the terminals $X_1$ and $Y_1$ are selected from the terminals $X_1, X_2, \ldots X_5, Y_1, Y_2, \ldots Y_5$ by selectively switching the switching elements, and a voltage V0 is applied to the terminals $X_1$ and $Y_1$, the voltage V0 is applied to pairs of the X-line electrodes 5 and the Y-line electrodes 2 such as $(x_1,y_1),(x_1,y_6), \ldots (x_1,y_{5N-4}),(x_6,y_1),(x_6,y_6) \ldots (x_6,y_{5N-4}), \ldots (x_{5M-4},y_1),(x_{5M-4},y_6) \ldots (x_{5M-4},y_{5N-4})$.

Because each of the gate electrode groups $G_{MN}$ is provided with a depletion layer surrounding itself, the depletion layer of the gate electrode group $G_{MN}$ is converted into an inversion layer by applying a negative voltage to the gate electrode group $G_{MN}$, so that the photoconducitve layer 3 including the gate electrode group $G_{MN}$ which receives the negative voltage to place it in a pinch off condition. On the contrary, when a positive voltage is applied to the gate electrode group $G_{MN}$, the photoconductive layer 3 turns on by expansion of the channel width.

As described above, if the voltage V0 is applied to between the terminals $X_{1b}$ and $Y_1$, and at the same time a positive potential is applied to the specific gate electrode group $G_{11}$, and a negative potential is applied to the other gate electrodes groups $G_{MN}$, the depletion layer of each of the other gate electrode groups $G_{MN}$ is converted into the inversion layer, so that the photoconductive layer 3 turns off. Therefore, a current can flow through the image read-out sensor portion interposed between the X-line and the Y-line electrodes $(x_1,y_1)$ including the mesh type gate electrode group $G_{11}$ therebetween. On the contary, the current cannot flow through the image read-out sensor portions interposed between the X-line and the Y-line electrodes $(x_1,y_6), \ldots (x_1,y_{5N-4}),(x_6,y_1),(x_6,y_2), \ldots (x_6,y_{5N-4}), \ldots (x_{5M-1},y_1),(x_{5M-4},y_6), \ldots (x_{5M-4},y_{5N-4})$ each including one of the other gate electrode groups $G_{MN}$ therebetween.

In this manner, the current which can flow through each of the image read-out sensor portions can be sequentially detected or read-out by switchingly selecting one of the X terminals for the X-line electrodes, one of the Y terminals for the Y-line electrodes, and one of the mesh type gate electrodes groups $G_{MN}$, respectively. Pairs of X-line electrodes and Y-line electrodes are selected by selecting one of the X terminals for the X-line electrodes and one of the Y terminals of the Y-line electrodes, and one of the selected pairs of the X-line electrodes and the Y-line electrodes is, further, selected by selecting one of the mesh gate electrodes $G_{MN}$.

Figure 4:
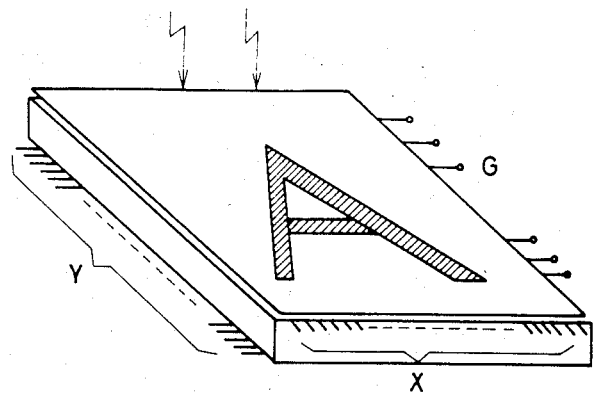
FIG. 4 shows a perspective view of the two-dimensional image read-out sensor device when an original document image is read-out.

The electrical property of the photoconductive layer 3 described above can bevaried by supplying light. As shown in FIG. 4, when an image on an original document is projected on the image read-out sensor portions by supplying light in the direction from the transparent X-line electrodes 5 as the upper electrodes to the Y-line electrodes 2 as the lower electrodes, carriers can be produced in the photoconductive layer 3 according to intensity of the illumination (light). The carriers produced at each of the image read-out sensor portions are detected and read-out by suitably selecting one of the X terminals for the X-line electrodes 5, one of the Y terminals for the Y-line electrodes 2, and one of the mesh type gate electrode groups $G_{MN}$ for the gate electrodes 4 responsive to the signals from the X-side, the Y-side, and the gate-side scanning circuits, respectively, and by sequentially supplying a voltage at each of the selected electrodes so that the two-dimensional image information may be converted into the electrical signals through successive carries to be read-out as the two dimensional image information.

In the first embodiment, an aluminium layer of about 0.2 $\mu$m in thickness is deposited on the insulating substrate 1 such as a glass by evaporating with a mask and the evaporated Al layer is converted into the Y-line stripe electrodes 2 with a density of about 10 electrodes/mm at the constant pitch of about 100 $\mu$m thorugh the use of the photolithography technique. An amorphous silicon hydride (a-Si:H) layer of about 1 $\mu$m in thickness is deposited as the photoconductive layer 3 on the substrate 1 at the temperature of about 200 degrees C. through the use of a plasma C.V.D. technique, and further, an amorphous silicon nitride hydride (a-SiN:H) insulating layer 4a of about 0.1 $\mu$m in thickness is deposited on the amorphous hydride (a-Si:H) layer in the same technique and temperature, and, thereafter, the resultant substrate 1 is exposed to the atmosphere.

The Al layer of about 0.2 $\mu$m in thickness is formed on the insulating layer 4a of the insulating substrate 1 by evaporating with the mask and the evaported Al layer is converted into the mesh type electrode groups $G_{MN}$ through the use of the photolithography technique.

The size of each of the holes in the mesh type electrode groups $G_{MN}$ is about 100 $\mu$m × 100 $\mu$m, and the interval between the two holes is of about 100 μm. The holes are formed over the Y-line stripe electrodes 2, and thereafter, the amorphous silicon nitride hydride (a-SiN:H) insulating layer 4a of about 0.1 μm is prepared on the Al layer in order to cover and coat the mesh type electrode group $G_{MN}$ by the insulating layer 4a. Unnecessary insulating layers 4a are eliminated.

After eliminating the unnecessary insulating layers 4a, the amorphous silicon hydride (a-Si:H) layer of about 5 μm in thickness as the photoconductive layer 3 is deposited in the mesh type electrode groups $G_{MN}$ through the use of plasma C.V.D. technique.

Finally, ITO (indium tin oxide) stripe electrodes as the X-line electrodes 5 are prepared, in the direction perpendicular to the Y-line electrodes as the lower stripe electrodes, on the photoconductive layer 3 through the use of an electron beam evaporation technique and the photolithograhy technique. Each of the holes of the mesh type gate electrode group $G_{MN}$ is formed at the each intersection between the X-line electrodes and the Y-line electrodes.

The image read-out sensor device with the resolution of 10 electrodes/mm is prepared so as to read the two-dimensional image information on an A4 size original document (320 mm(X direction)×230 mm (Y direction)). As shown in FIG. 4, the transparent A4 size original document is in contact with the sensor device, and the image on the A4 size original document is projected on the image read-out sensor portions by supplying light in the arrow direction. A character "A" is assumed to be writen on the A4 size document.

The image read-out sensor device with the resolution of 10 electrodes/mm includes "3200" electrodes and "2300" Y-line electrodes (I=3200, J=2300). The photoconductive layer 3 interposed between the "3200" X-line electrodes and the "2300" Y-line electrodes functions image read-out sensor portions as the picture elements of "3200×2300".

The "3200" X-line electrodes 5 are divided to groups of X-line electrodes, for example, the number of groups is "20" (M=20) and the number of X-line electrode in the single group is "160" (K=160). The "2300" Y-line electrodes 2 are divided to groups of Y-line electrodes, for example, the number of groups is "10" (N=10), and the number of Y-line electrodes in the single group is "230" (L=230).

Each group of X-line electrodes have the first to the 160th electrodes. The X-line k-th (k: 1-160) electrodes selected from each of "20" groups of X-line electrodes are connected to each other in common to provide "160" X terminals for connecting to each of the switching elements in the X-side scanning circuit. Each group of Y-line elctrodes have the first to the 230th electrodes. The Y-line "l"th (l: 1-230) electrodes selected from each of groups of Y-line electrodes are connected to each other in common to provide "230" terminals for connecting to each of the switching elements in the Y-side scanning circuit.

Therefore, the X-line electrodes of "160" and the Y-line electrodes of "230" form a single block area, and the number of blocks in the entire sensor device is "200" because of the presence of "20" groups of X-line electrodes and "10" groups of Y electrodes. Each of the mesh type gate electrode groups $G_{MN}$ (M: 1-20, N: 1-10) extends over one of the blocks each including the X electrodes of "230" and type Y-line electrodes of "160" arranged in matrix. The gate electrodes 4 in each of the gate electrode groups $G_{MN}$ are connected to each other in common to provide a single gate terminal for connecting to the switching element in the gate scanning circuit, so that the number of gate terminals is "200".

The image on the A4 size original document is sequentially and switchingly scanned by supplying clock pulses having frequencies of about 4.0 MHz and about 1.2 KHz to the X-line electrodes 5 and the Y-line electrodes 2, respectively, and at the same time, the voltage is sequentially applied to each of gate electrode groups $G_{MN}$ according to the selected X and Y electrodes, so that the A4 size document image can be read-out in about 2 seconds.

In a case where one electrode corresponds to one switching element, "5500" switching elements are needed on the above image read-out sensor device. In the present invention, the number of switching elements is "160" (for the X-line electrodes)+"230" (for the Y-line electrodes)+"200" (for the gate electrode groups), so that the switching elements can be reduced.

In the above embodiment, although a metal coated with the oxidization layer is used as the gate electrode material, a material having a polarity inverse to that of the photoconductive layer may be used for the gate electrode material in order to form a P-N junction layer. Therefore, each of the gate electrodes 4 is in the metal insulative semiconductor (MIS) P-N construction. In such a case, the operation of the gate electrode 4 is performed by expansion or contraction of the channel width in response to the supply of the voltage being similar to a junction type field effect transistor (FET).

Each of the gate electrodes 4 may be in a metal semiconductor (MES) construction including in a schottky barrier layer between each of the gate electrodes and the photoconductive layer.

(Example II)

In the above first embodiment, a crosstalk current may flow through the same gate electrode group area. To reduce the crosstalk current, a schottky diode is disposed between the photoconductive layer 3 at each intersection between the X-line and Y-line electrodes and each of the Y-line electrodes 2 or each of the X-line electrodes 5. Each of the schottky diodes functions as the blocking diode.

In the another embodiment of the present invention, the X-line or the Y-line electrodes 5 and 2 are made of Pt, and each of the X-line electrodes or the Y-line electrodes forms a schottky junction.

Accordingly, the crosstalk current can be remarkably reduced by forming the blocking diodes using the schottky junction and the signal ratio of brightness between the "light" and the "dark" is improved.

(Example III)

FIGS., 5(a) and 5(b) show a partially sectional view and a plan view of a two dimensional image read-out sensor device according to still another embodiment of the present invention.

In the still another embodiment, the gate electrodes for controlling read-out of light outputs produced in the photoconductive layer interposed between the X-line electrodes and the Y-line electrodes are formed by using thin film transistors (TFTs) inserted into read-out circuits for reading light outputs.

Figure 5:
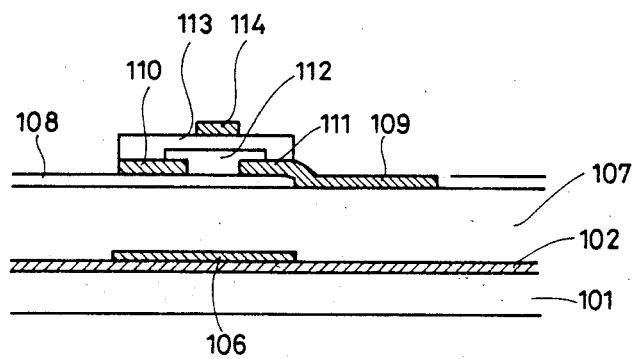
FIGS. 5(a) and 5(b) show a partially sectional view and a plan view of an two-dimensional image read-out sensor device according to still another embodiment of the present invention, respectively.
Figure 5:
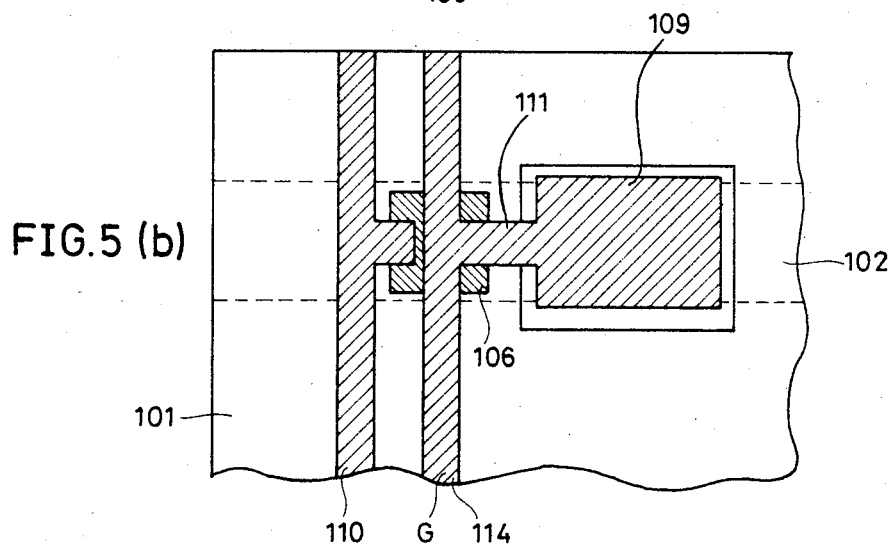

As shown in FIGS. 5(a) and 5(b), transparent Y-line stripe electrodes 102 used as the lower electrodes and made of indium tin oxide, NESA etc. are formed in stripe on an insulating substrate 101 such as a glass.

A light interruption layer 106 made of Cr is deposited on an area of the Y-line electrode 102 corresponding to a channel position of each of the TFTs by evaporating and photoetching.

A first semiconductor layer 107 such as an amorphous silicon hydride (a-Si:H) layer of about 1 μm in thickness covers the Y-line electrodes 102 and the light interruption layer 106 through the use of the plasma C.V.D., and then, a first insulating layer 108 such as an amorphous silicon nitride hydride (a-SiN:H) layer of about 1000 Å in thickness is formed on the first semiconductor layer 107 by the plasma C.V.D. The first insulating layers 108 covered the area of each of the picture elements is removed by photoetching.

X-line electrodes 109, source electrodes 110 and drain electrodes 111 of the TFTs are formed on the first insulating layer 108 and the first semiconductor layer 107 by evaporating with Al and by photoetching.

Second semiconductor layers 112 such as an amorphous silicon hydride (a-Si:H) layer are deposited by the plasma C.V.D. method so as to cover a part of each of the drain and the source electrodes 110 and 111 formed over each of the Y-line electrodes 102, and, further, second insulating layers 113 such as the amorphous silicon nitride hydride (a-SiN:H) layer are formed by the plasma C.V.D. so as to cover the drain and the source electrodes 110 and 111 and the second semiconductor layer 112 formed over each of the Y-line electrodes 102.

Each of gate electrodes 114 is formed on each of the second insulating layer 113 by evaporating with Al and by photoetching.

Figure 6:
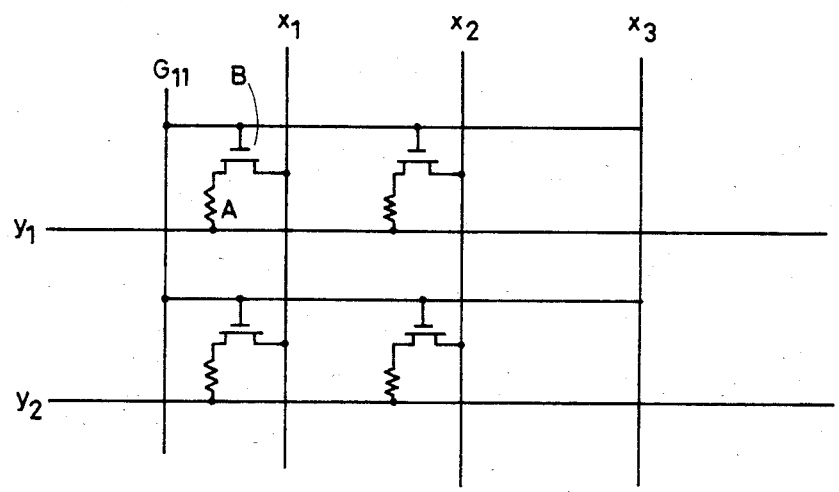
FIG. 6 shows an equivalent circuit of the two-dimensional image read-out sensor device of FIGS. 5(a) and 5(b)

FIG. 6 shows an equivalent circuit of the two-dimensional image read-out sensor device of FIGS. 5(a) and 5(b).

The X-line and the Y-line electrodes 109 and 102 are arranged with the same manner as the X-line electrodes 5 and the Y-line electrodes 2 in FIG. 1. The gate electrodes 114 are disposed over pairs of X-line electrodes and Y-line electrodes within the single block area including the X-line electrodes of "K" and the Y-line electrodes of "L" are connected to each other in common so as to form a group $G_{MN}$ of gate electrodes, so that terminals for connecting each of the gate electrode groups $G_{MN}$ to each of the switching elements in the gate-side scanning circuit are provided by the number of blocks. The single group of the gate electrodes 114 is designated by $G_{MN}$ (M: 1–M, N: 1–N).

If a voltage V0 is applied to the X-line electrode $x_1$ and the Y-line electrode $y_1$, and, further, a positive potential is applied to the gate electrode $G_{11}$, a thin film transistor B connected to the gate electrode $G_{11}$ turns on and a current flows through a resistance A formed by the photoconductive layer 107, so that the current at each of picture elements can be read-out by selecting one of the X terminal for the X electrodes, one of the Y terminals for the Y-line electrodes, and one of the gate electrode groups $G_{MN}$, respectively.

In the image read-out sensor device having the above construction, the number of terminals for connecting each of the X-line electrodes 109, each of the Y-line electrodes 102, and the each of gate electrode groups $G_{MN}$ to the switching elements in each of the X-side, the Y-side, and the gate-side scanning circuits, respectively, can be reduced.

Because the gate electrodes 114 of the TFTs disposed on each of the picture elements in the single block area are connected to each other in common to provide a single terminal, it is unnecessary that each of TFTs is turned on/off per picture element. Therefore, a response with a remarkably high frequency is not needed because of switching each of the groups of TFTs, and some load supplied on each of the TFTs is reduced.

The photoconductive layer 107 and the channel portion 112 of each of the TFTS are made of the same material, such as amorphous silicon hydride, so that the manufacturing process can be easy.

In the same manner as described in the another embodiment, the schottky diodes can be formed by selecting the material of the upper electrodes (the X-line electrodes), and the crosstalk current can be remarkably reduced.

In still other embodiments, though a stagger type TFT is used, a reverse stagger type TFT, a coplanar type TFT, and a reverse coplanar type TFT may be used.

In case where the reverse coplanar type TFT is used, source electrodes 115, drain electrodes 117, and gate electrodes 116 are formed on a glass substrate 131, and an amorphous silicon hydride (a-Si:H) layer 118 as the photoconductive layer covers the gate electrodes 116, the source electrodes 115, and the drain electrodes 117. The amorphous silicon hydride (a-Si:H) layer at the single picture element area S and the amorphous silicon hydride (a-Si:H) layer at the channel portion of each of the TFTs are integrally formed by controlling the doping of the amorphous silicon hydride (a-Si:H) layer 118. Therefore, the image read-out sensor device has a simple construction.

Figure 7:
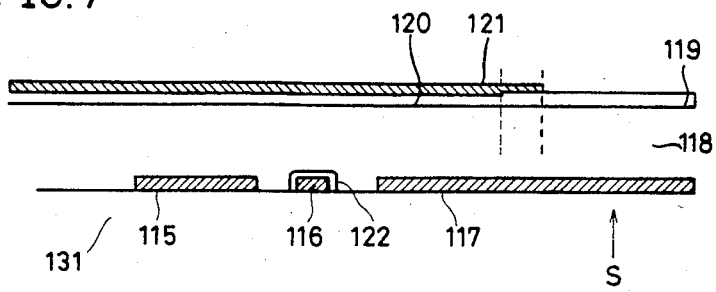
FIG. 7 shows a partially sectional view of a two-dimensional image read-out sensor device of a further embodiment of the present invention.

In FIG. 7, each of transparent electrodes 119 as upper electrodes is formed on the picture element area of the amorphous silicon hydride layer 118. An Al layer 121 are formed on the other areas except the picture element areas of the amorphous silicon hydride layer 118 so as to interrupt light via an insulating layer 120.

The Al layer 121 functions as an electrode, so that the Al layer 121 is connected to the transparent electrodes 119. Gate insulating layer is designated by 122.

To obtain a large size picture element area, the TFT and the picture element electrode can be layered.

The material of the photoconductive layer should not be limitted by the described material.

The invention being thus described, it will be obvious that the same may be varied in many ways. Such variations are not to be regarded as a departure from the spirit and scope of the invention, and all such modifications are intended to be included within the scope of the following claims.

What is claimed is:

1. A two-dimensional image read-out device comprising:
    an insulating substrate;
    a plurality of Y-line electrodes formed on the insulating substrate and arranged parallel with each other;
    a plurality of X-line electrodes formed over the insulating substrate and arranged parallel with each other in a direction perpendicular to the Y-line electrodes;
    a photoconductive layer interposed between the Y-line and the X-line electrodes;
    gate electrodes for selecting a pair of the Y-line and the X-line electrodes; and scanning circuit means for selecting some of the Y-line electrodes, and some of the X-line electrodes, and at least one of the gate electrodes, respectively.

2. A two-dimensional image read-out sensor device comprising:

an insulating substrate;

a plurality of Y-line electrodes formed on the insulating substrate and arranged parallel with each other, the Y-line electrodes being divided to groups of the Y-line electrodes, each group of the Y-line electrodes having the first to the L-th (L: an integral $\geq 2$) Y-line electrodes in which "l"-th (l: 1–L) Y-line electrodes selected from each of the groups of the Y-line electrodes are connected in common to provide Y-side terminals of "L", a plurality of X-line electrodes formed over the insulating substrate and arranged parallel with each other in a direction perpendicular to the Y-line electrodes, the X-line electrodes being divided into groups of the X-line electrodes, each of groups of the X-line electrodes having the first to the K-th (K: an integral $\geq 2$) X-line electrodes in which k-th X-line electrodes (k: 1–K) selected from each of the groups of the X-line electrodes are connected in common to provide X-side terminals of "K";

a photoconductive layer interposed between the Y-line and the X-line electrodes;

a plurality of gate electrodes for selecting a pair of the X-line and the Y-line electrodes, the gate electrodes being divided to groups of the gate electrodes, the gate electrodes in every group being connected to each other in common to provide a single gate terminal, said each of the groups of the gate electrodes being extended over each area including the Y-line electrodes of "L" and the X-line electrodes of "K" arranged in a matrix;

Y-side scanning means, connected to the Y-side terminals, for selecting some of the Y-line electrodes;

X-side scanning means, connected to the X-side terminals, for selecting some of the X-line electrodes, and gate scanning means, connected the gate terminals, for selecting at least one of the gate electrodes.

3. The device of claim 2, wherein the gate electrode groups are interposed in the photoconductive layer and are formed in a mesh shape.

4. The device of claim 3, wherein each of the gate electrode groups controls the current amount in the photoconductive layer by changing the gate electrode potential.

5. The device of claim 3, further comprising an insulating layer for covering on the surface of each of the gate electrode groups which is in contact with the photoconductive layer.

6. The device of claim 3, further comprising a schottky junction formed at the interface between the each of the mesh type gate electrode groups and the photoconductive layer in which the surface of the gate electrode is in contact with the photoconductive layer.

7. The device of claim 3, further comprising a p-N junction formed at the interface between each of the mesh type gate electrode groups and the photoconductive layer.

8. The device of claim 2, further comprising a schottky junction formed at the interface between each of the Y-line electrodes and the photoconductive layer.

9. The device of claim 2, further comprising a schottky junction formed at the interface between each of the X-line electrodes and the photoconductive layer.

10. The device of claim 2, wherein the gate electrode is provided with a thin film transistor inserted into a current path between each of the Y-line electrodes and each of the X-line electrodes.

11. The device of claim 1 wherein said gate electrodes are arranged into a plurality of gate electrode groups, said gate electrode groups being interposed in the photoconductive layer and formed in a mesh shape.

12. The device of claim 11, wherein each of the gate electrode groups controls the current amount in the photoconductive layer by changing the gate electrode potential.

13. The device of claim 11, further comprising an insulating layer for covering on the surface of each of the gate electrode groups which is in contact with the photoconductive layer.

14. The device of claim 11, further comprising a schottky junction formed at the interface between the each of the mesh type gate electrode groups and the photoconductive layer in which the surface of the gate electrode is in contact with the photoconductive layer.

15. The device of claim 11, further comprising a P-N junction formed at the interface between each of the mesh type gate electrode groups and the photoconductive layer.

16. The device of claim 1, further comprising a schottky junction formed at the interface between each of the Y-line electrodes and the photoconductive layer.

17. The device of claim 1, further comprising a schottky junction formed at the interface between each of the X-line electrodes and the photoconductive layer.

18. The device of claim 1, wherein the gate electrode is provided with a thin film transistor inserted into a current path between each of the Y-line electrodes and each of the X-line electrodes.

* * * * *